United States Patent
Inoue et al.

(10) Patent No.: US 12,107,571 B2
(45) Date of Patent: Oct. 1, 2024

(54) CONTROL CIRCUIT FOR POWER CONVERSION APPARATUS

(71) Applicant: DENSO CORPORATION, Kariya (JP)

(72) Inventors: Kent Inoue, Kariya (JP); Kouichi Nishibata, Kariya (JP)

(73) Assignee: DENSO CORPORATION, Kariya (JP)

(*) Notice: Subject to any disclaimer, the term of this patent is extended or adjusted under 35 U.S.C. 154(b) by 175 days.

(21) Appl. No.: 17/942,011

(22) Filed: Sep. 9, 2022

(65) Prior Publication Data

US 2023/0006664 A1     Jan. 5, 2023

Related U.S. Application Data

(63) Continuation of application No. PCT/JP2021/005295, filed on Feb. 12, 2021.

(30) Foreign Application Priority Data

Mar. 10, 2020   (JP) .................. 2020-041029

(51) Int. Cl.
H03K 17/082 (2006.01)
H02M 1/32 (2007.01)
H03K 17/16 (2006.01)

(52) U.S. Cl.
CPC ....... H03K 17/0828 (2013.01); H03K 17/168 (2013.01); H02M 1/32 (2013.01)

(58) Field of Classification Search
CPC .......... H02M 1/32; H02M 1/08; H02M 1/322; H02M 1/327; H02M 1/36; H02M 7/5387; H02M 7/53871; H02M 7/797; H02P 27/06; H02P 29/024; H02P 29/0241; H02P 3/18; H02P 29/027; H02P 29/032; H02P 29/60; H02P 29/66; H02P 27/04; H02P 27/08; H02P 3/12; H02P 3/22; H02P 25/022; H02P 25/062; H02P 25/064; H02P 2207/05; H02P 1/26; H02P 1/46; H02P 6/28; H03K 17/18; H03K 2017/0806

See application file for complete search history.

(56) References Cited

U.S. PATENT DOCUMENTS

2009/0009920 A1   1/2009   Yamada
2020/0044457 A1*   2/2020   Miyake .................. G01R 31/40

FOREIGN PATENT DOCUMENTS

| JP | 2017-225236 A | 12/2017 |
| JP | 2019-122238 A | 7/2019 |
| JP | 2020-065341 A | 4/2020 |

* cited by examiner

*Primary Examiner* — Antony M Paul
(74) *Attorney, Agent, or Firm* — Oliff PLC

(57) ABSTRACT

A control circuit of a power conversion apparatus is provided with a switch driving unit that drives the upper and lower arm switches; a short circuit control unit that causes the switch driving unit to execute a short circuit control when a failure occurs in the system, the short circuit control turning an ON side switch to an ON state and turning an OFF side switch to an OFF state; a checking unit that executes a checking process to check whether the short circuit control is able to perform correctly; and a protection control unit that causes the switch driving unit to execute a protection control when a failure occurs on either the upper arm switch or the lower arm switch, the protection control turning the switch where the failure occurs to an OFF state. The control circuit enables the protection control during execution of the checking process.

2 Claims, 9 Drawing Sheets

COMPARATIVE EXAMPLE

CONTROL CIRCUIT FOR POWER CONVERSION APPARATUS

CROSS REFERENCE TO RELATED APPLICATIONS

This application is the U.S. bypass application of International Application No. PCT/JP2021/5295 filed on Feb. 12, 2021, which designated the U.S. and claims priority to Japanese Patent Application No. 2020-041029 filed on Mar. 10, 2020, the contents of both of these are incorporated herein by reference.

BACKGROUND

Technical Field

The present disclosure relates to a control circuit for a power conversion apparatus having upper and lower arm switches electrically connected to respective phase windings of a rotary electric machine.

Description of the Related Art

For this type of control circuit, a shutdown control may be performed in which upper and lower arm switches are controlled to be forcibly in an OFF state when an abnormality occurs on the rotary electric machine that constitutes the system. In the case where a reverse voltage occurs in the winding due to a rotation of the rotor constituting the rotary electric machine during the shutdown control being executed, the line voltage of the windings may be higher than the voltage of the storage unit which is parallelly connected to the series-connected bodies of the upper and lower arm switches. The situation where the line voltage is high may be caused by, for example, a large amount of field magnetic flux of the rotor or a high speed of the rotor.

SUMMARY

The present disclosure is provided with a control circuit of a power conversion apparatus adapted for a system provided with a storage unit, a multiphase rotary electric machine, a power conversion apparatus having upper and lower arm switches electrically connected to each winding in multiphase windings of the rotary electric machine. The control circuit includes: a switch driving unit that drives the upper and lower arm switches; a short circuit control unit that causes the switch driving unit to execute a short circuit control; a checking unit that executes a checking process to check whether the short circuit control is able to performed correctly; and a protection control unit that causes the switch driving unit to execute a protection control.

BRIEF DESCRIPTION OF THE DRAWINGS

The above-described objects and other objects, features and advantages of the present disclosure will be clarified further by the following detailed description with reference to the accompanying drawings. The drawings are.

DETAILED DESCRIPTION OF THE PREFERRED EMBODIMENTS

Figure 1:
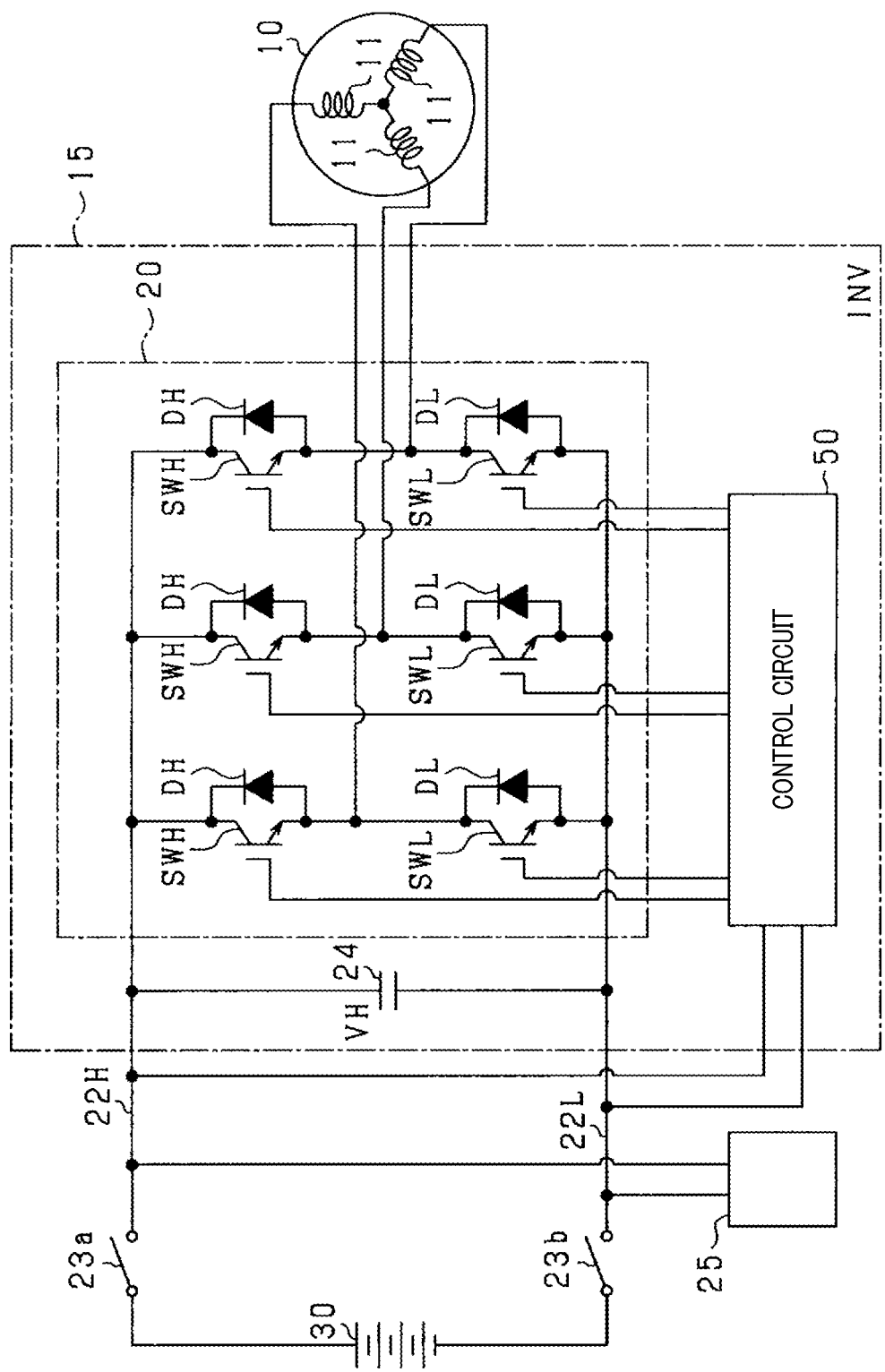
FIG. 1 is an overall circuit diagram showing a control system according to a first embodiment of the present disclosure.

According to a control circuit of a power conversion apparatus, a shutdown control may be performed in which upper and lower arm switches are controlled to be forcibly in an OFF state when an abnormality occurs on the rotary electric machine that constitutes the system. In the case where a reverse voltage occurs in the winding due to a rotation of the rotor constituting the rotary electric machine during the shutdown control being executed, the line voltage of the windings may be higher than the voltage of the storage unit which is parallelly connected to the series-connected bodies of the upper and lower arm switches. The situation where the line voltage is high may be caused by, for example, a large amount of field magnetic flux of the rotor or a high speed of the rotor.

When the line voltage of the windings is higher than the voltage of the storage unit, despite an execution of the shutdown control, a so-called regeneration is performed where the induced current occurred in the windings flows through a closed circuit including a diode reverse-connected to a switch, the winding and the storage unit. As a result, there is a concern that an over voltage failure occurs in which a DC voltage in the storage unit side of the power conversion apparatus significantly increases, and may cause a malfunction on at least one of the storage unit, the power conversion apparatus and equipment other than the power conversion apparatus connected to the storage unit.

As disclosed in patent literature, JP-A-2017-225236, a control circuit in order to deal with such a problem is known in which a short circuit control is performed such that the ON switches in either one arm of the upper arm and lower arm are turned ON and the OFF switches in the other arm are turned OFF.

In a situation where the short circuit control is required to be executed, in order to accurately execute the short circuit control, it may preferably be checked in advance whether the short circuit control is correctly performed. When this checking process is performed in advance, the following problem may occur.

A short circuit failure in the OFF side switch between upper and lower arm switches may occur. In the case where the short circuit failure occurs, if the ON side switch is switched to the ON state to determine whether the short circuit control is correctly performed, a short circuit occurs in the upper and lower circuits. As a result, an over current (short circuit current) flows through upper and lower arm switches and may cause a malfunction on the upper and lower arm switches.

In light of the above-described circumstances, hereinafter, embodiments of the present disclosure will be described.

First Embodiment

A first embodiment where a control circuit according to the present disclosure is embodied will be described with reference to the drawings. The control circuit according to the present embodiment is applied to a three-phase inverter as a power conversion apparatus. In the present embodiment, the control system provided with an inverter is mounted to a vehicle such as an electric vehicle and a hybrid vehicle.

As shown in FIG. 1, the control system is provided with a rotary electric machine 10 and an inverter 15. The rotary electric machine 10 serves as an on-vehicle main machine in which the rotor thereof is configured to be capable of transmitting a motive force to the driving wheel. According to the present embodiment, as the rotary electric machine, a synchronous machine is used. More specifically, a permanent magnet synchronous machine is used.

The inverter 15 is provided with a switching device unit 20. The switching device unit 20 includes three series-connected bodies each configured of an upper arm switch SWH and a lower arm switch SWL for three phases. In each phase, a first end of a winding 11 of the rotary electric machine 10 is connected to a connection point between the upper arm switch SWH and the lower arm switch. The second ends of respective windings 11 are connected at the neutral point. The respective windings 11 are arranged to be shifted by 120° of electrical angle. According to the present embodiment, as the respective switches SWH and SWL, voltage control type semiconductor switching elements are used. More specifically, IGBTs are used. For the upper and lower arm switches SWH and SWL, upper and lower arm diodes DH and DL are connected in reverse as free-wheel diodes.

A positive electrode of a high voltage power source 30 is connected to collectors of respective upper arm switches SWH via a high voltage side electrical path 22H. A negative electrode of the high voltage power source 30 is connected to emitters of the respective lower arm switches SWL via a low voltage side electrical path 22L. According to the present embodiment, the high voltage power source 30 is a secondary battery of which the output voltage (i.e. rated voltage) is several hundreds voltages, for example.

A first cutoff switch 23a is disposed on the high voltage side electrical path 22H, and a second cutoff switch 23b is disposed on the low voltage side electrical path 22L. The respective switches 23a and 23b are each configured as a relay or a semiconductor switching element. The respective switches 23a and 23b may be driven by a control circuit 50 included in the inverter 15 or may be driven by an upper-level ECU which is not shown. The upper-level ECU is configured as a host processor relative to the control circuit 50.

The inverter 15 is provided with a smoothing capacitor 24 as a storage unit. The smoothing capacitor 24 electrically connects between a point on the high voltage side electrical path 22H which is closer to a switching device unit 20 side than the position of the first cutoff switch 23a and a point on the low voltage side electrical path 22L which is closer to a switching device unit 20 side than the position of the second cutoff switch 23b.

The control system is provided with an on-vehicle electrical equipment 25. The electrical equipment 25 includes at least either an electrical compressor or a DC-DC converter. The electrical compressor constitutes an in-cabin air conditioner, and is driven by being supplied with power from the high voltage power source 30 so as to circulate the cooling of the on-vehicle refrigerating cycle. The DC-DC converter steps down the output voltage of the high voltage power source 30 and supplies the stepped-down voltage to the on-vehicle low voltage load. The low voltage load includes a low voltage power source 31 shown in FIG. 2. According to the present embodiment, the low voltage power source 31 is configured as a secondary battery (e.g. lead-acid battery) of which the output voltage, for example, 12 volts (rated voltage) is lower than the output voltage (rated voltage) of the high voltage power source 30.

Figure 2:
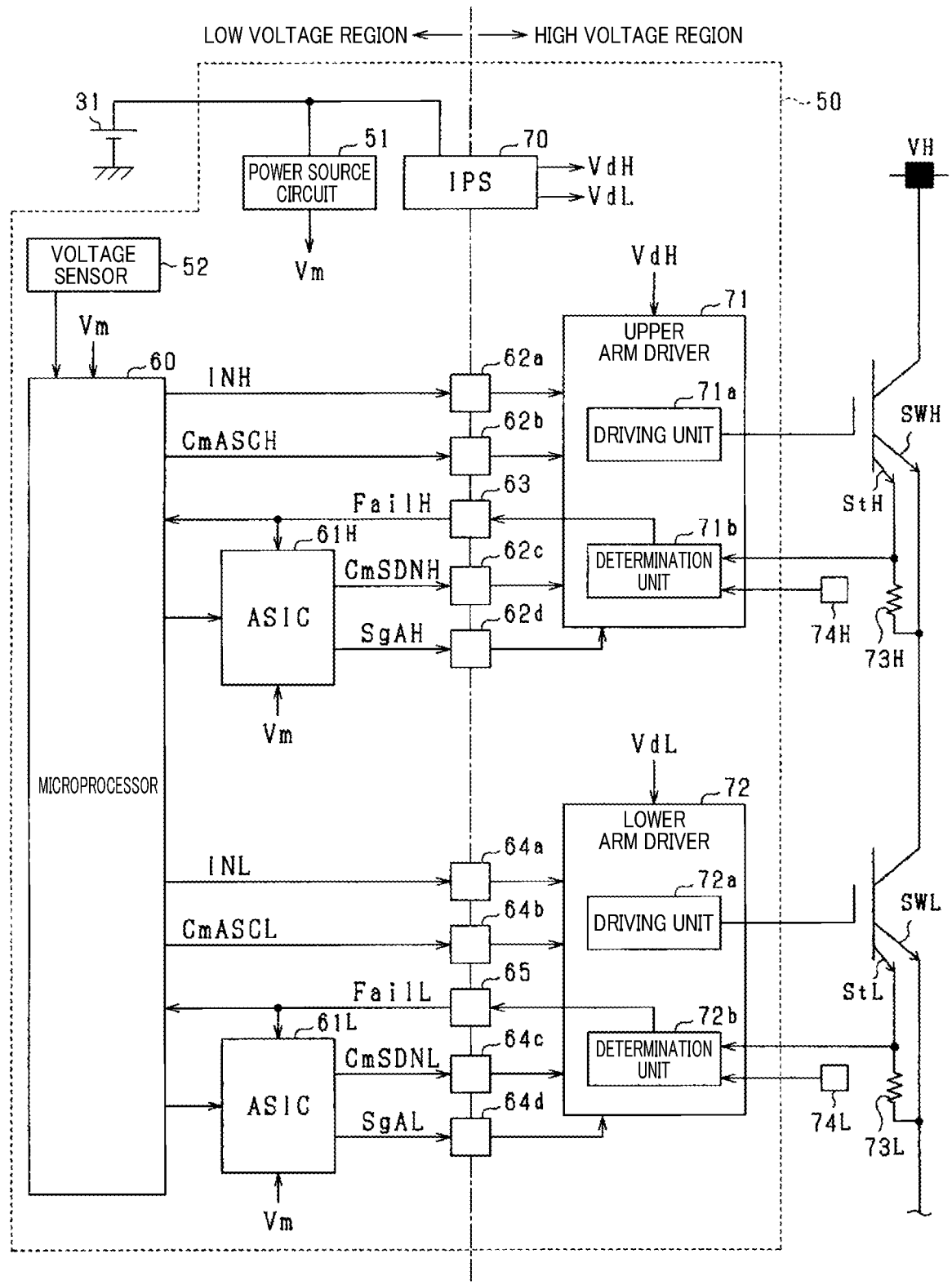
FIG. 2 is a block diagram showing a control circuit and a peripheral circuit thereof.

A configuration of the control circuit 50 will be described with reference to FIG. 2.

The control circuit 50 is provided with a power source circuit 51. The positive terminal of the low voltage power source 31 is connected to the power source circuit 51 via a fuse which is not shown. At the negative terminal of the low voltage power source 31, a ground as the earth potential is connected thereto. The power source circuit 51 generates, based on the voltage supplied from the low voltage power source 31, a power source voltage Vm which is supplied to respective configurations in the low voltage region side of the control circuit 50. The power source circuit 51 steps down the output voltage of the low voltage power source 31, thereby generating the power source voltage Vm. Note that a plurality of power source circuits are provided in the low voltage region of the control circuit 50, which are simply referred to as the power source circuit 51.

The control circuit 50 is provided with a microprocessor 60 in the low voltage region thereof. The microprocessor 60 includes a CPU and other peripheral circuits. The peripheral circuits include an input-output unit for exchanging the signals from/to external units and an AD converter. The microprocessor 60 is capable of operating by being supplied with the power source voltage Vm of the power source circuit 51.

The control circuit 50 is provided with an upper arm processing unit 61H and a lower arm processing unit 61L. The voltage sensor 52 is electrically connected to the high voltage side electrical path 22h and the low voltage side electrical path 22L to detect the terminal voltage of the smoothing capacitor 24. The terminal voltage detected by the voltage sensor 52 is inputted to the microprocessor 60. The microprocessor 60 determines whether the terminal voltage of the smoothing capacitor 24 detected by the voltage sensor 52 exceeds the upper limit voltage thereof. When determined that the terminal voltage exceeds the upper limit voltage thereof, the microprocessor 60 determines that an overvoltage failure occurs.

The upper arm processing unit 61H and the lower arm processing unit 61L are provided in the low voltage region and are configured to be capable of operating by being supplied with the power source voltage Vm of the power source circuit 51. Further, the respective arm processing units 61H and 61L are constituted by ASIC.

The microprocessor 60 functions as a switch command generation unit that generates a switching command for the respective switches SWH and SWL of the switching device unit 20 so as to control the control quantity of the rotary electric machine 10 to be the command value. The control quantity is, for example, a torque. The switching command is either an ON command that indicates driving of the switch to be ON or an OFF command that indicates driving of the switch to be OFF. The microprocessor 60 generates the switching command such that the upper arm switch SWH and the lower arm switch SWL are alternately ON in the respective phases.

The control circuit 50 is provided with an insulation power source 70, an upper arm driver 71 and a lower arm driver 72. According to the present embodiment, the upper arm driver 71 is provided for each upper arm switch SWH individually, and the lower arm driver 72 is provided for each lower arm switch SWL individually. Hence, six drivers 71 and 72 are provided in total.

The insulation power source 70 generates, based on the voltage supplied from the low voltage power source 31, an upper arm drive voltage VdH supplied to the upper arm driver 71 and a lower arm drive voltage VdL supplied to the lower arm driver 72 and outputs the generated upper and lower arm drive voltages VdH and VdL. The insulation power source 70 is provided in the low voltage region and the high voltage region in the control circuit 50 to be positioned across the boundary between the low voltage region and the high voltage region. The respective drivers 71 and 72 are provided in the high voltage region.

Note that the insulation power source 70 is provided with upper arm insulation power sources individually provided for respective upper arm drivers 71 for three phases, and a lower arm insulation power source commonly provided for lower arm drivers 72 for three phases. Note that, the lower arm insulation power source may be provided individually for respective three-phase lower arm drivers 72.

The upper arm switch SWH is provided with an upper arm sense terminal StH. At the upper arm sense terminal StH, a fine current which correlates with the collector current of the upper arm switch SWH flows therethrough. The current flowing through the upper arm sense terminal StH is detected as an electrical potential at an upper arm sense resistor 73H (hereinafter referred to as upper arm sense voltage VsH).

The lower arm switch SWL is provided with a lower arm sense terminal StL. At the lower arm sense terminal StL, a fine current which correlates with the collector current of the lower arm switch SWL flows therethrough. The current flowing through the lower arm sense terminal StL is detected as an electrical potential at a lower arm sense resistor 73L (hereinafter referred to as lower arm sense voltage VsL).

The inverter 15 is provided with an upper arm temperature sensor 74H and a lower arm temperature sensor 74L. The upper arm temperature sensor 74H detects the temperature of the upper arm switch SWH, and the lower arm temperature sensor 74L detects the temperature of the lower arm switch SWL. The respective temperature sensor 74H and 74L are configured as a temperature sensitive diode or a thermistor.

The upper arm driver 71 is provided with an upper arm driving unit 71a as a switch driving unit and an upper arm determination unit 71b. The upper arm driver 71 is configured to be capable of operating by being supplied with the upper arm drive voltage Vdh of the insulation power source 70. The upper arm driving unit 71a accepts an upper arm switching command INH from the microprocessor 60 via a first upper arm transmission unit 62a. The first upper arm transmission unit 62a is provided in the low voltage region and the high voltage region to be positioned across the boundary between the low voltage region and the high voltage region. The first upper arm transmission unit 62a transmits signals between the low voltage region and the high voltage region while electrically insulating between the low voltage region and the high voltage region. The first upper arm transmission unit 62a is configured as a photo coupler or a magnetic coupler, for example.

The upper arm driving unit 71a supplies a charge current to the gate of the upper arm switch SWH when the upper arm switching command INH transmitted from the microprocessor is an ON command. Thus, the gate voltage of the upper arm switch SWH is higher than or equal to the threshold voltage Vth and the upper arm switch SWH turns to ON state. On the other hand, when the upper arm switching command INH is OFF command, the upper arm driving unit 71a causes the discharge current to flow from the gate of the upper arm switch SWH to the emitter side thereof. Thus, the gate voltage of the upper arm switch SWH is less than the threshold voltage Vth and the upper arm switch SWH turns to OFF state.

The upper arm determination unit 71b accepts the upper arm sense voltage VsH and a detection value of the upper arm temperature sensor 74H. The upper arm determination unit 71b determines that an over current failure occurs on the upper arm switch SWH when determined that the upper arm sense voltage VsH exceeds the over current threshold. Further, the upper arm determination unit 71b determines that an over heating failure occurs on the upper arm switch SWH when determined that the temperature detected by the upper arm temperature sensor 74H exceeds a temperature threshold. The upper arm determination unit 71b, when determined that an over current failure or an over heating failure occurs on the upper arm switch SWH, outputs an upper arm failure signal FailH as information indicating an occurrence of failure to the microprocessor 60 and the upper arm processing unit 61H via an upper arm failure transmission unit 63. According to the present embodiment, the upper arm determination unit 71b, when determined that an over current failure or an over heating failure occurs on the upper arm switch SWH, switches the logical state of the upper arm failure signal FailH from L to H. The upper arm failure transmission unit 63 is configured as a photo coupler or a magnetic coupler, for example.

The lower arm driver 72 is provided with a lower arm driving unit 72a as a switch driving unit and a lower determination unit 72b. The lower arm driver 72 is configured to be capable of operating by being supplied with the lower arm drive voltage VdL. The lower arm driving unit 72a accepts a lower arm switching command INL from the microprocessor 60 via the first lower arm transmission unit 64a. The first lower arm transmission unit 64a is configured as a photo coupler or a magnetic coupler, for example.

The lower arm driving unit 72a supplies a charge current to the gate of the lower arm switch SWL when the lower arm switching command INL transmitted from the microprocessor 60 is an ON command. Thus, the gate voltage of the lower arm switch SWL is higher than or equal to the threshold voltage Vth and the lower arm switch SWL turns to ON state. On the other hand, when the lower arm switching command INL transmitted from the microprocessor 60 is OFF command, the lower arm driving unit 72a causes the discharge current to flow from the gate of the lower arm switch SWL to the emitter side thereof. Thus, the gate voltage of the lower arm switch SWL is less than the threshold voltage Vth and the lower arm switch SWL turns to OFF state.

The lower arm determination unit 72b accepts the lower arm sense voltage VsL and a detection value of the lower arm temperature sensor 74L. The lower arm determination unit 72b determines that an over current failure occurs on the lower arm switch SWL when determined that the lower arm sense voltage VsL exceeds the over current threshold. Further, the lower arm determination unit 72b determines that an over heating failure occurs on the lower arm switch SWL when determined that the temperature detected by the lower arm temperature sensor 74L exceeds a temperature threshold. The lower arm determination unit 72b, when determined that an over current failure or an over heating failure occurs on the lower arm switch SWL, outputs a lower arm failure signal FailL as information indicating an occurrence of failure to the microprocessor 60 and the lower arm processing unit 61L via a lower arm failure transmission unit 65. According to the present embodiment, the lower arm determination unit 72b, when determined that an over current failure or an over heating failure occurs on the lower arm switch SWL, switches the logical state of the lower arm failure signal FailL from L to H. The lower arm failure transmission unit 65 is configured as a photo coupler or a magnetic coupler, for example.

The control circuit 50 is configured to be capable of performing a three-phase short circuit control (i.e. active short circuit: ASC). Specifically, the microprocessor 60 outputs an upper arm ASC command CmASCH to the upper arm driving unit 71a via a second upper arm transmission unit 62b, and outputs a lower arm ASC command CmASCL to the lower arm driving unit 72a via a second lower arm transmission unit 64b. Note that the second upper arm transmission unit 62b and the second lower arm transmission unit 64b are configured as a photo coupler or a magnetic coupler. Note that the microprocessor 60 includes a short circuit control unit.

The control circuit 50 is capable of performing an over current and over heating protection control. Specifically, the upper arm processing unit 61H outputs, when determined that the accepted upper arm failure signal FailH is logical H, an upper arm shutdown command CmSDNH to the upper arm driving unit 71a via a third upper arm transmission unit 62c. The upper arm driving unit 71a changes, when determined that upper arm shutdown command CmSDNH is accepted, the state of the upper arm switch SWH to be OFF regardless of the upper arm switching command INH and the upper arm ASC command CmASCH.

The lower arm processing unit 61L outputs, when determined that the lower arm failure signal FailL is logical H, the lower arm shutdown command CmSDNL to the lower arm driving unit 72a via a third lower arm transmission unit 64c. The lower arm driving unit 72a changes, when determined that lower arm shutdown command CmSDNL is accepted, the state of the lower arm switch SWL to be OFF regardless of the lower arm switching command INL and the lower arm ASC command CmASCL. Note that, the third upper arm transmission unit 62c and the third lower arm transmission unit 64c are configured as a photo coupler or a magnetic coupler. Further, according to the present embodiment, the upper arm processing unit 61H and the lower arm processing unit 61L include protection control unit.

The microprocessor 60 commands the upper arm processing unit 61H to output the upper arm disabling signal SgAH. The upper arm disabling signal SgAH outputted from the upper arm processing unit 61H is transmitted to the upper arm driving unit 71a via a fourth upper arm transmission unit 62d. Note that the fourth upper arm transmission unit 62d is configured as a photo coupler or a magnetic coupler, for example.

According to the present embodiment, the upper arm driving unit 71a enables the shutdown control when determined that the logical state of the upper arm disabling signal SgAH is logical H. In other words, the upper arm driving unit 71a enables, when determined that the logical state of the upper arm disabling signal SgAH is H, a function for causing the upper arm switch SWH to be OFF when the upper arm shutdown command CmSDNH is accepted.

On the other hand, the upper arm driving unit 71a disables the shutdown control when determined that the logical state of the upper arm disabling signal SgAH is L. In other words, the upper arm driving unit 71a does not enable, when determined that the logical state of the upper arm disabling signal SgAH is L, a function for causing the upper arm switch SWH to be OFF even when the upper arm shutdown command CmSDNH is accepted. In this case, the upper arm driving unit 71a changes the upper arm switch SWH to be in an ON state or OFF state in accordance with the upper arm ASC command CmASCH.

The microprocessor 60 commands the lower arm processing unit 61L to output the lower arm disabling signal SgAL. The lower arm disabling signal SgAL outputted from the lower arm processing unit 61L is transmitted to the lower arm driving unit 72a via the fourth lower arm transmission unit 64d. Note that the fourth lower arm transmission unit 64d is configured as a photo coupler or a magnetic coupler.

According to the present embodiment, the lower arm driving unit 72a enables the shutdown control when determined that the logical state of the lower arm disabling signal SgAL is H. In other words, the lower arm driving unit 72a enables, when determined that the logical state of the lower arm disabling signal SgAL is H, a function for causing the lower arm switch SWL to be OFF when the lower arm shutdown command CmSDNL is accepted.

On the other hand, the lower arm driving unit 72a disables the shutdown control when determined that the logical state of the lower arm disabling signal SgAL is L. In other words, the lower arm driving unit 72a does not enable, when determined that the logical state of the lower arm disabling signal SgAL is L, a function for causing the lower arm switch SWL to be OFF even when the lower arm shutdown command CmSDNL is accepted. In this case, the lower arm driving unit 72a changes the lower arm switch SWL to be in an ON state or OFF state in accordance with the lower arm ASC command CmASCL. According to the present embodiment, the upper arm processing unit 61H and the lower arm processing unit 61L include disabling control unit.

Subsequently, with reference to a flowchart shown in FIG. 3, a three-phase short circuit control executed by the microprocessor 60 during a normal control state will be described. Note that the normal control state refers to a state where the microprocessor 60 generates and outputs the upper and lower arm switching commands INH and INL so as to translate the control quantity of the rotary electric machine 10 to be its command value.

At step S10, the process determines whether an execution condition of the three-phase short circuit control is satisfied. According to the present embodiment, the execution condition includes a condition where an over voltage failure occurs. Note that, a determination whether an over voltage failure occurs can be made based on the detection value of the voltage sensor 52 as described above.

When the determination at step S10 is negative, the normal control state is maintained. On the other hand, when the determination at step S10 is affirmative, the process proceeds to step S11, and determines whether a short failure on the upper arm switch SWH or an open failure on the lower arm switch SWL occurs. Note that, which arm in the upper arm switch SWH and lower arm switch SWL, which phase a failure occurs and contents of the failure can be determined based on, for example, respective failure signals FailH and FailL outputted from the respective determination units 71b and 72b of the respective drivers 71 and 72.

When the determination at step S11 is affirmative, the process proceeds to step S12 and executes the upper arm ASC. The lower arm ASC refers to a process in which the upper arm ASC command CmASCH to the upper arm drivers 71 of three-phases are set to be ON command and the lower arm ASC command CmASCL to the lower arm drivers 72 of three-phases are OFF command. In this case, the upper arm switch SWH corresponds to ON side switch and the lower arm switch SWL corresponds to OFF side switch.

When the determination at step S11 is negative, the process proceeds to step S13 and executes the lower arm ASC. The lower arm ASC refers to a process in which the lower arm ASC command CmASCL to the lower arm drivers 72 of three-phases are set to be ON command and the upper arm ASC command CmASCH to the upper arm drivers 71 of three-phases are OFF command. In this case, the lower arm switch SWL corresponds to ON side switch and the upper arm switch SWH corresponds to OFF side switch.

Thus, the microprocessor 60, when determined that a short circuit failure occurs on at least one switch in either one arm between the upper arm and the lower arm, outputs an ON command to respective switches of the three-phases in the arm where the short circuit failure occurs between the upper arm and the lower arm, and outputs an OFF command to respective switches of the three-phases in the other arms. On the other hand, the microprocessor 60, when determined that an open circuit failure occurs on at least one switch in either one arm between the upper arm and the lower arm, outputs an ON command to respective switches of the three-phases in an arm other than the arm where the open circuit failure occurs between the upper arm and the lower arm, and outputs an OFF command to respective switches of the three-phases in the other arms.

Figure 3:
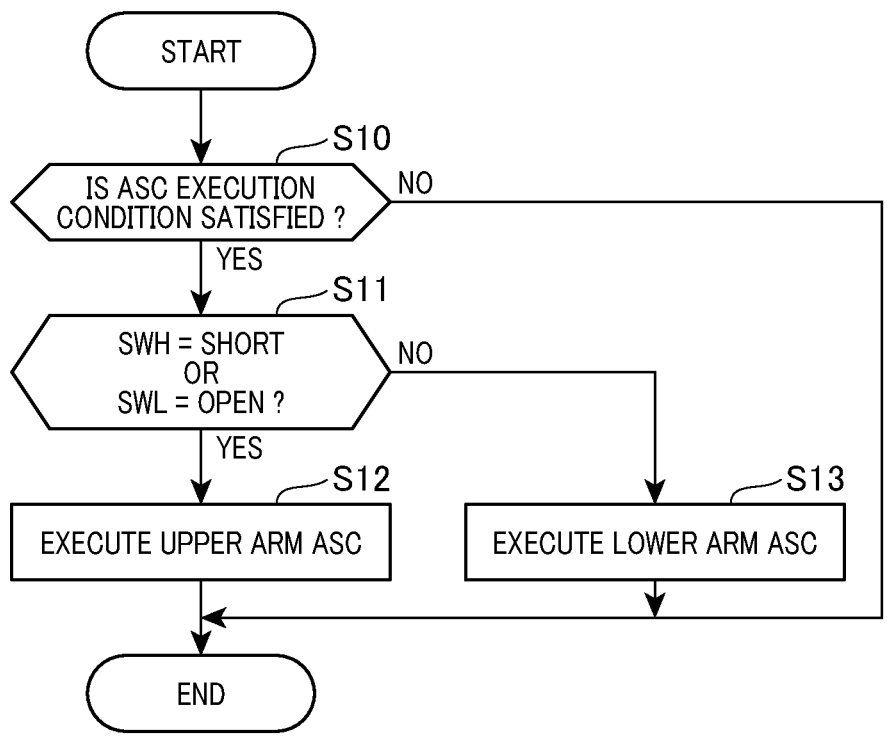
FIG. 3 is a flowchart showing a control procedure of a three-phase short circuit control.

In the process shown in FIG. 3, it is assumed that the lower arm ASC is executed when the upper and lower arm switches SWH and SWL operate normally. Note that a configuration may be utilized in which the upper arm ASC is executed when the upper and lower arm switches SWH and SWL operate normally.

Figure 4:
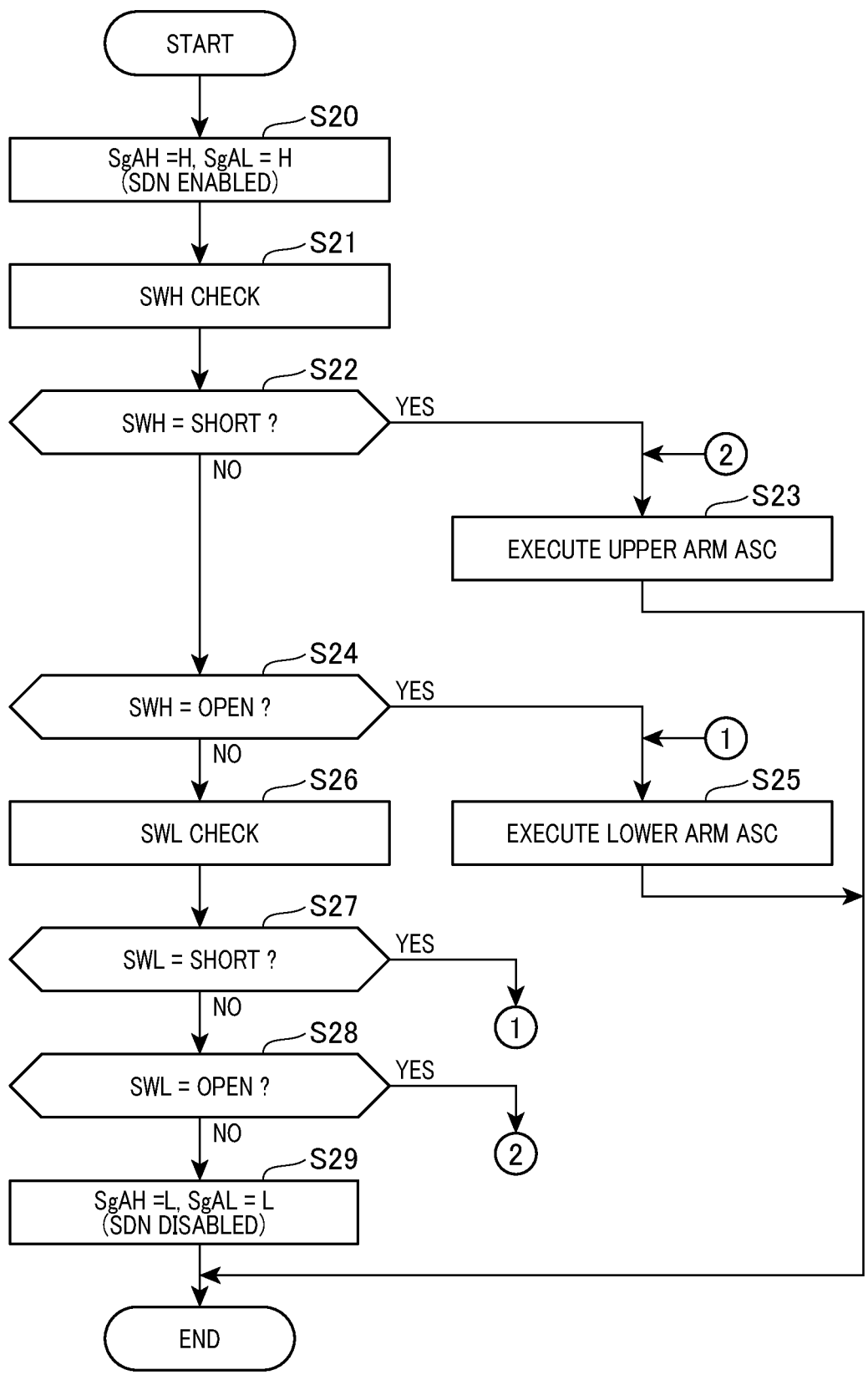
FIG. 4 is a flowchart showing a procedure of a checking process.

Subsequently, with reference to FIG. 4, a process for checking whether three-phase short circuit control is able to operate normally will be described. This process is provided in view of functional safety, and executed by the microprocessor 60. Also, this process is executed for at least one time at any timing during one period from when the normal control starts to when the control system is stopped.

At step S20, when the logical state of the upper arm disabling signal SgAH is L, the process commands the upper arm processing unit 61H to change the logical state of the upper arm disabling signal SgAH to be H. Further, when the lower arm disabling signal SgAL is L, the process commands the lower arm processing unit 61L to change the logical state of the lower arm disabling signal SgAL to be L. The process at step S20 is for enabling the execution command of the shutdown control to the upper arm driving unit 71a and the upper arm determination unit 71b.

At step S21, the process determines whether an abnormality occurs on the upper arm switch SWH. This determination includes a determination whether an open failure or a short failure occurs on the upper arm switch SWH. For example, in the case where the upper arm ASC command CmASCH is set to be ON command, the process determines that an open failure occurs on the upper arm switch SWH when determined that voltage VcH between the collector and the emitter of the upper arm switch SWH is close to the terminal voltage of the smoothing capacitor 24. Also, in the case where the upper arm ASC command CmASCH is set to be OFF command, the process determines that a short circuit failure occurs on the upper arm switch SWH when determined that voltage VcH between the collector and the emitter of the upper arm switch SWH is close to 0V.

At step S22, the process determines whether a short circuit failure occurs on the upper arm switch SWH based on the processing result of the step S21. When the determination at step S22 is affirmative, the process proceeds to step S23 and executes the above-described upper arm ASC.

When the determination at step S22 is negative, the process proceeds to step S24 and determines whether an open failure occurs on the upper arm switch SWH based on the processing result at step S21. When the determination at step S24 is affirmative, the process proceeds to step S25 and executes the above-described lower arm ASC process.

When the determination result at step S24 is negative, the process determines that the upper arm switch SWH is normal and proceeds to step S26. At step S26, the process determines whether an abnormality occurs on the lower arm switch SWL. For example, in the case where the lower arm ASC command CmASCL is set to be ON command, the process determines that an open failure occurs on the lower arm switch SWL when the voltage VcL between the collector and the emitter of the lower arm switch SWL is close to the terminal voltage of the smoothing capacitor 24. Further, in the case where the lower arm ASC command CmASCL is set to be OFF command, the process determines that a short circuit failure occurs on the lower arm switch SWL when the voltage VcL between the collector and the emitter of the lower arm switch SWL is close to 0V.

At step S27, the process determines whether a short circuit failure occurs on the lower arm switch SWL based on the processing result of the step S26. When the determination at step S27 is affirmative, the process proceeds to step S25 and executes the lower arm ASC process.

When the determination at step S27 is negative, the process proceeds to step S28 and determines whether an open failure occurs on the lower arm switch SWL based on the processing result at step S26. When the determination at step S28 is affirmative, the process proceeds to step S23 and executes the above-described upper arm ASC.

When the determination result at step S28 is negative, the process determines that the lower arm switch SWL is normal and proceeds to step S29. At step S29, the process commands the upper arm processing unit 61H to change the logical state of the upper arm disabling signal SgAH to be L. Further, the process commands the lower arm processing unit 61L to change the logical state of the lower arm disabling signal SgAL to be L. The process at step S29 is for disabling the execution command of the shutdown control to the upper arm driving unit 71a and the upper arm determination unit 71b. According to the present embodiment, the processes at steps S21, S22, S24, S26, S27 and S28 correspond to checking unit. In the case where the shutdown control is not required to be disabled, the process at step S29 can be omitted.

According to the present embodiment, the process at step S20 is executed because of the following reasons. A short circuit failure may occur at a lower arm switch SWL in the upper and lower arm switches SWH and SWL, for example. In a state where the short circuit failure occurs, when the upper arm ASC command CmASCH is set to be ON command by a process at step S21 shown in FIG. 4, the upper arm switch SWH is turned to be in an ON state and causes short failure between the upper arm circuit and the lower arm circuit. As a result, an over current (short-circuit current) flows through the upper arm switch SWH and the lower arm switch SWL and the reliability of the upper and lower arm switches SWH and SWL may be lowered. In particular, when the first and second cutoff switches 23a and 23b are ON state, since the degree of lowering the reliability of the upper and lower arm switches SWH and SWL is large, and may cause a malfunction.

Here, when the above-described upper and lower arm short-circuit failure occurs, the upper and lower arm processing units 61H and 61L to which the upper and lower arm failure signals FailH and FailL are transmitted, output the upper and lower arm shutdown commands CmSDNH and CmSDNL. When the process at step S20 is executed, in the subsequently executed checking process, an execution command for the shutdown control to the upper arm driving unit 71a and the upper arm determination unit 71b is enabled. Hence, even when a short circuit failure occurs between the upper and lower arm circuits, the upper and lower arm switches SWH and SWL are turned OFF. Thus, when the checking process is executed, the upper and lower arm switches SWH and SWL can be protected from an over current.

Figure 5:
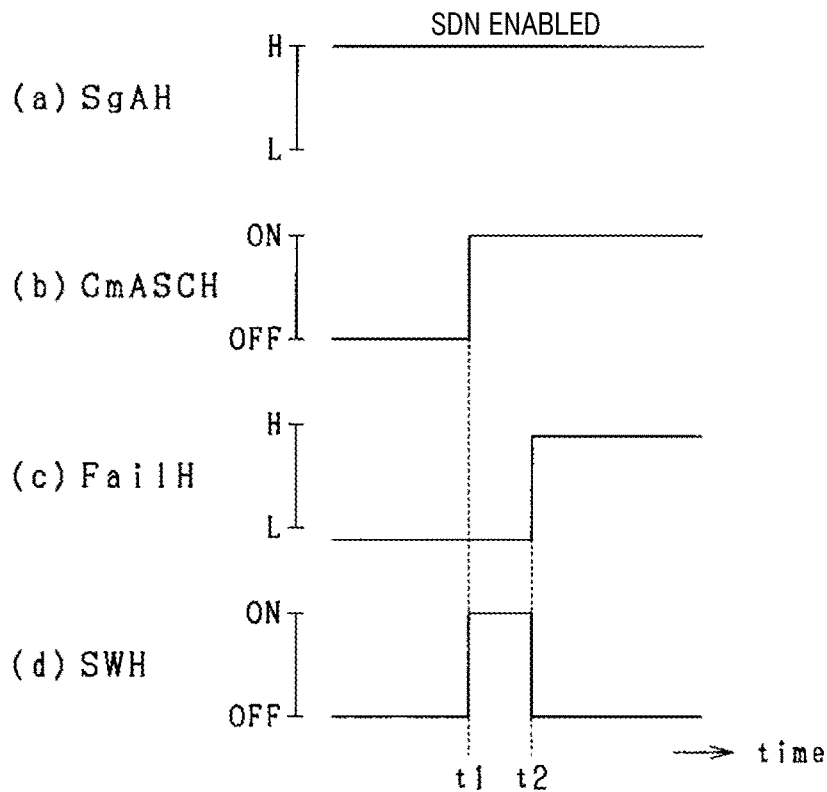
FIG. 5 is a timing diagram showing a trend of a driving state or the like of a switch during the checking process.

With reference to a timing diagram shown in FIG. 5, a case will be descried where a checking process is executed when a short circuit failure occurs on the lower arm switch SWL. FIG. 5 (a) shows a trend of the upper arm disabling signal SgAH, and FIG. 5 (b) shows a trend of the upper arm ASC command CmASCH. FIG. 5 (c) shows a trend of the upper arm failure signal FailH, and FIG. 5 (d) shows a trend of a driving state of the upper arm switch SWH.

At time t1, the upper arm ASC command CmASCH is turned to ON command, and the upper arm switch SWH is turned to ON state. Thus, a short circuit failure between the upper arm and the lower arm occurs, and the logical state of the upper arm failure signal FailH outputted from the upper arm determination unit 71b is changed to H. Since the logical state of the upper arm disabling signal SgAH outputted from the upper arm processing unit 61H to the upper arm driving unit 71a is H, when the upper arm shutdown command CmSDHN outputted from the upper arm processing unit 61H is transmitted to the upper arm driving unit 71a, the upper arm switch SWH is changed to OFF state.

Figure 6:
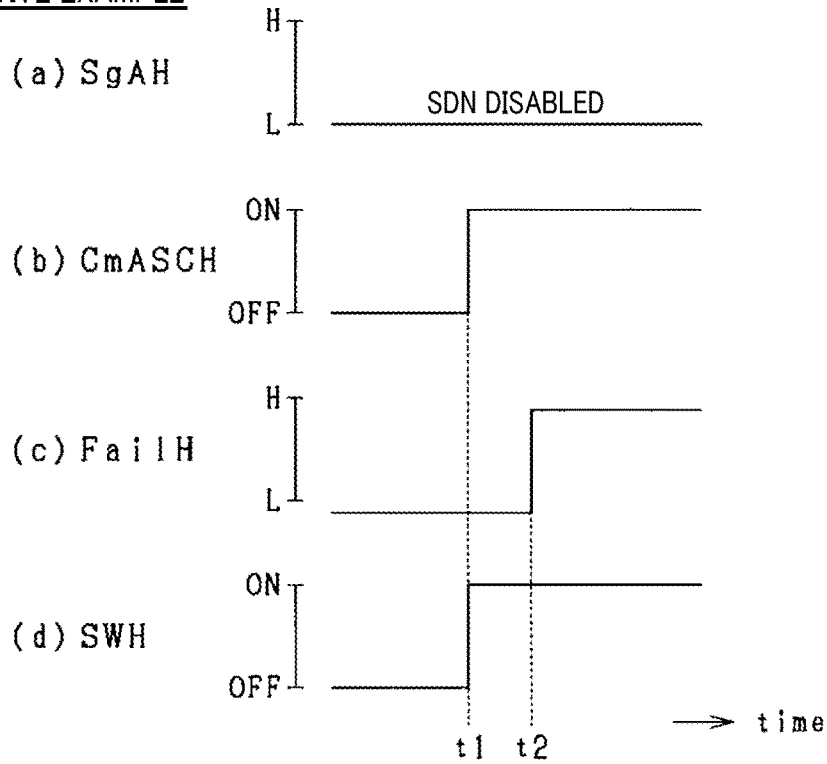
FIG. 6 is a timing diagram showing a trend of a driving state or the like of a switch during a checking process according to a comparative example.

In contrast, as shown in FIG. 6, according to a comparative example where the upper arm disabling signal SgAH is set to be L, even if the logical state of the upper failure signal FailH is changed to H at time t2, the upper arm switch SWH is not changed to OFF state. Note that, FIG. 6 (a) to (d) correspond to FIG. 5 (a) to (d).

According to the above-described embodiment, when the check process is executed, the upper and lower arm switches SWH and SWL can be protected from an over current.

Modification Example of First Embodiment

Figure 7:
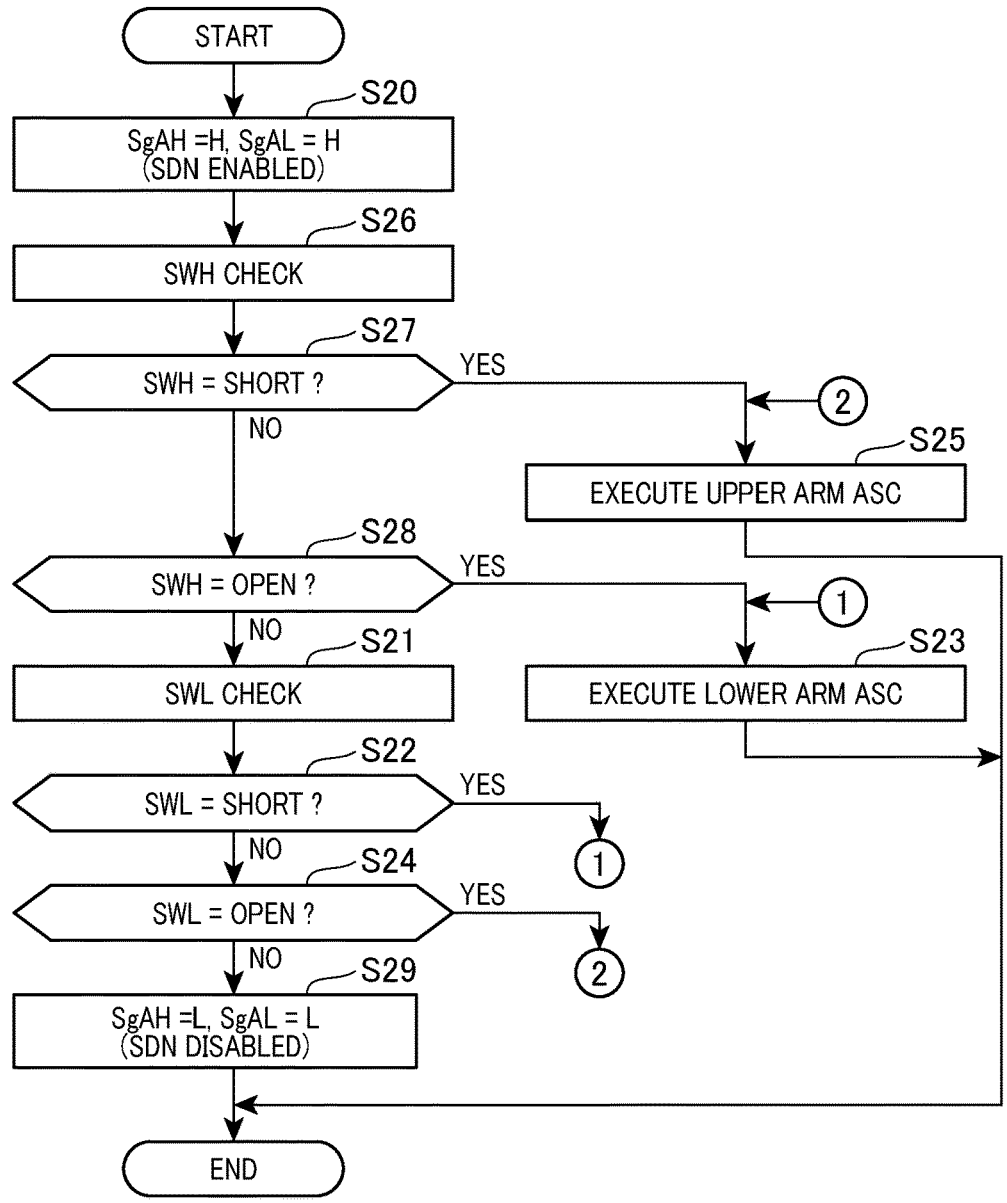
FIG. 7 is a flowchart showing a procedure of the checking process according to a modification example of the first embodiment.

As shown in FIG. 7, the checking process of the lower arm switch SWL may be executed first, and then the checking process of the upper arm switch SWH may be executed next. In FIG. 7, the same reference numbers are applied to processes which are the same as those shown in FIG. 4 for the sake of convenience.

The disabling signal outputted from the respective arm processing units 61H and 61L may be pulse signal. When describing the upper arm side as an example, if the pulse signal is utilized in which the logical state of the upper arm disabling signal SgAH is switched between H and L, in the case where the execution command of the shutdown control is disabled and the logical state of the upper arm disabling signal SgAH is fixed to H or L, the execution command of the shutdown control may be enabled.

The upper arm determination unit 71b may output, when determined that an over current failure or a over heating failure occurs, the upper arm shutdown command CmSDNH to the upper arm driving unit 71a. Further, the lower arm determination unit 72b may output, when determined that an over current failure or an over heating failure occurs, a lower arm shutdown command CmSDNL to the lower arm driving unit 72a.

Without using an insulation transmitting device such as a photo coupler or a magnetic coupler, a signal may be exchanged between the low voltage region and the high voltage region in the control circuit 50 with a communication method. As the communication method, SPI (registered trade mark), CAN, UART, Ethernet (registered trade mark) and parallel communication may be utilized. Moreover, the communication may be a binary digital signal or a duty signal, for example.

Second Embodiment

Hereinafter, with reference to the drawings, for a second embodiment, configurations different from those in the first embodiment will mainly be described.

In the three-phase short circuit control being executed, when the upper and lower arm processing units 61H and 61L output the upper and lower arm shutdown commands CmSDNH and CmSDNL, the control is changed to the shutdown control from the three-phase short circuit control. In this case, the terminal voltage of the smoothing capacitor 24 significantly increases and may cause an over voltage failure.

Figure 8:
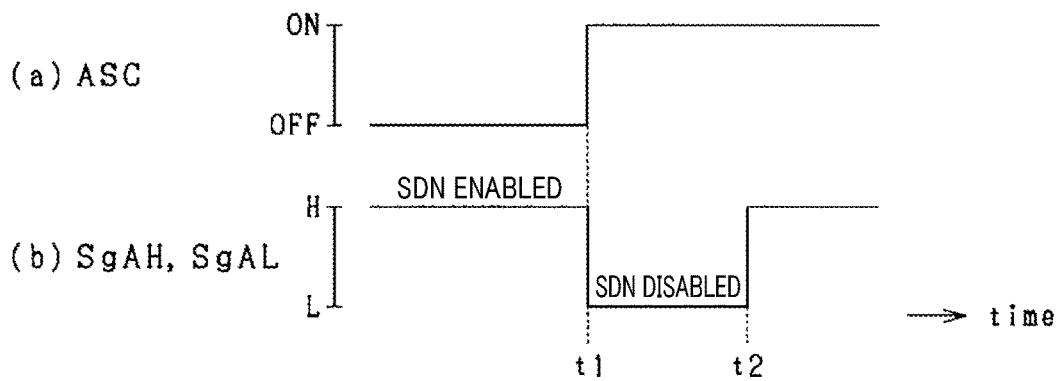
FIG. 8 is a timing diagram showing a disabling state of a shutdown control according to a second embodiment.

In this respect, according to the present embodiment, as shown in FIG. 8, the logical state of the upper and lower arm disabling signals SgAH and SgAL outputted from the upper and lower arm processing units 61H and 61L are set to be L during a period from a time t1 at which the three-phase short circuit control is started to a time t2 at which a predetermined period elapses from the time t1. Thus, the over voltage failure is prevented from occurring. Note that the microprocessor 60 may command the upper arm processing unit 61H at the time t2 to change the logical state of the upper arm disabling signal SgAH to be H and command the lower arm processing unit 61L at the time t2 to change the logical state of the lower arm disabling signal SgAL to be H. Thereafter, the checking process shown in FIG. 4 may be executed in this case.

Here, in the case where the upper and lower arm disabling signals SgAH and SgAL transmitted to the upper and lower arm driving units 71a and 72a are not normal, the shutdown control is unable to be disabled even if necessary. In this case, in the three-phase short circuit control being executed, there is a concern that the shutdown control may be executed as described above.

According to the present embodiment, the microprocessor 60 performs a disabling signal checking process for checking whether the upper and lower disabling signals SgAH and SgAL are outputted normally from the upper and lower arm processing units 61H and 61L and whether the upper and lower arm driving units 71a and 72a accept the outputted upper and lower arm disabling signal SgAH and SgAL normally. Note that the microprocessor 60 includes signal determination unit.

Figure 9:
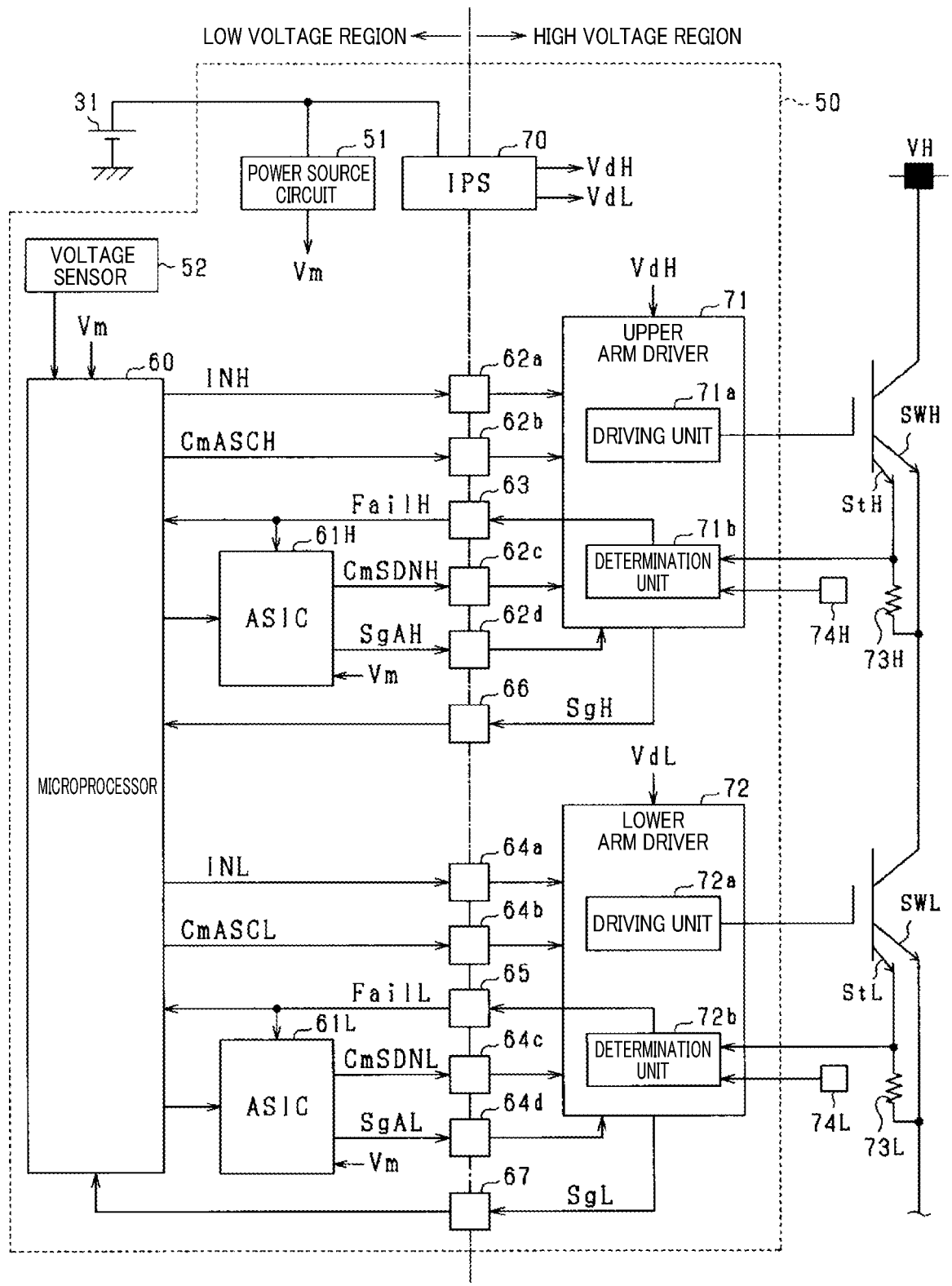
FIG. 9 is a block diagram showing a control circuit and a peripheral circuit thereof.

FIG. 9 shows a control circuit 50 and a peripheral circuit thereof according to the present embodiment. In FIG. 9, the same reference numbers are applied to configurations which are the same as those shown in FIG. 2 for the sake of convenience.

The control circuit 50 is provided with an upper arm signal transmission unit 66 and a lower arm signal transmission unit 67. The respective signal transmission units 66 and 67 are configured as a photo coupler or a magnetic coupler, for example.

In a period where the three-phase short circuit control is not performed, the microprocessor 60 commands the upper and lower arm processing units 61H and 61L to output the upper and lower arm ASC command CmASCH and CmASCL which correspond to the upper arm ASC and the lower arm ASC. Thereafter, the upper and lower arm drivers 71 and 72 output the accepted upper and lower arm ASC commands CmASCH and CmASCL as the upper and lower arm checking signal SgH and SgL to the microprocessor 60 via the upper and lower arm signal transmission units 66 and 67.

The microprocessor 60 monitors the accepted upper and lower arm checking signals SgH and SgL and compares the monitored upper and lower arm checking signals SgH and SgL with the upper and lower arm ASC commands CmASCH and CmASCL outputted from the upper and lower arm processing units 61H and 61L, thereby checking whether the upper and lower disabling signals SgAH and SgAL are outputted normally and whether the upper and lower arm driving units 71a and 72a accept the outputted upper and lower arm disabling signal SgAH and SgAL normally.

According to the above-described present embodiment, the shutdown control can be prevented from being executed during a period from when the three-phase short circuit control starts to when a predetermined period elapses.

Third Embodiment

Figure 10:
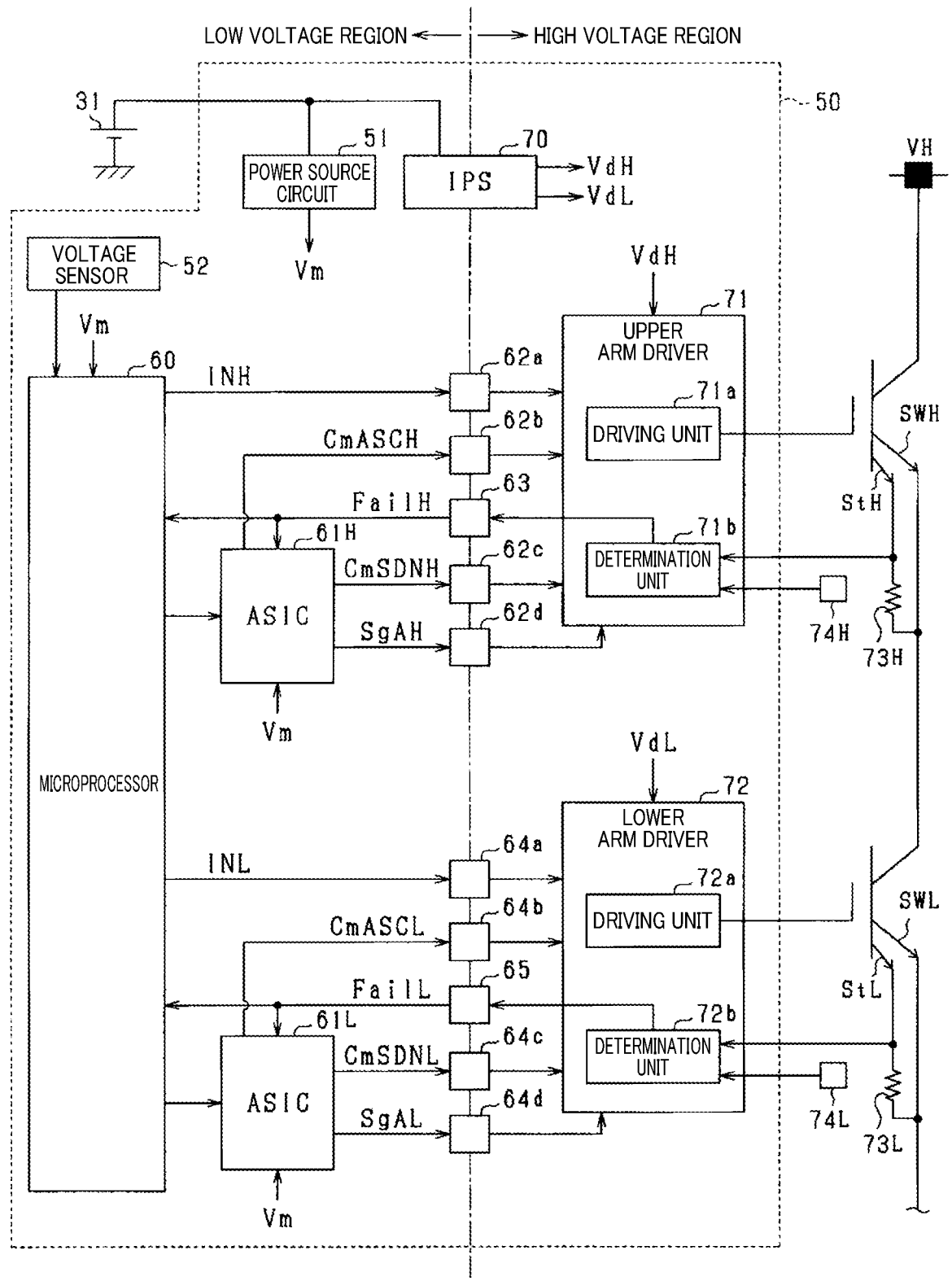
FIG. 10 is a block diagram showing a control circuit and a peripheral circuit thereof according to a third embodiment.

Hereinafter, with reference to the drawings, for a third embodiment, configurations different from those in the first embodiment will mainly be described. FIG. 10 shows a control circuit 50 and a peripheral circuit thereof according to the present embodiment. In FIG. 10, the same reference numbers are applied to configurations which are the same as those shown in FIG. 2 for the sake of convenience.

According to the present embodiment, instead of using the microprocessor 60, the upper arm processing unit 61H outputs the upper arm ASC command CmASCH. Further, instead of using the microprocessor 60, the lower arm processing unit 61L outputs the lower arm ASC command CmASCL.

For example, the upper and lower arm processing units 61H and 61L may output, when information indicating an over voltage failure is acquired from the microprocessor 60, the upper and lower arm ASC commands CmASCH and CmASCL corresponding to the upper arm ASC and the lower arm ASC. Further, for example, instead of using a configuration in which the information indicating an over voltage failure is acquired from the microprocessor 60, the upper and lower arm processing units 61H and 61L may acquire the detection value of the voltage sensor 52 and determine whether an over voltage failure occurs or not based on the acquired detection value. According to the present embodiment, the upper arm processing unit 61H and the lower arm processing unit 61L include short circuit control unit.

According to the above-described present embodiment, effects and advantages similar to those of first embodiment can be acquired.

Fourth Embodiment

Figure 11:
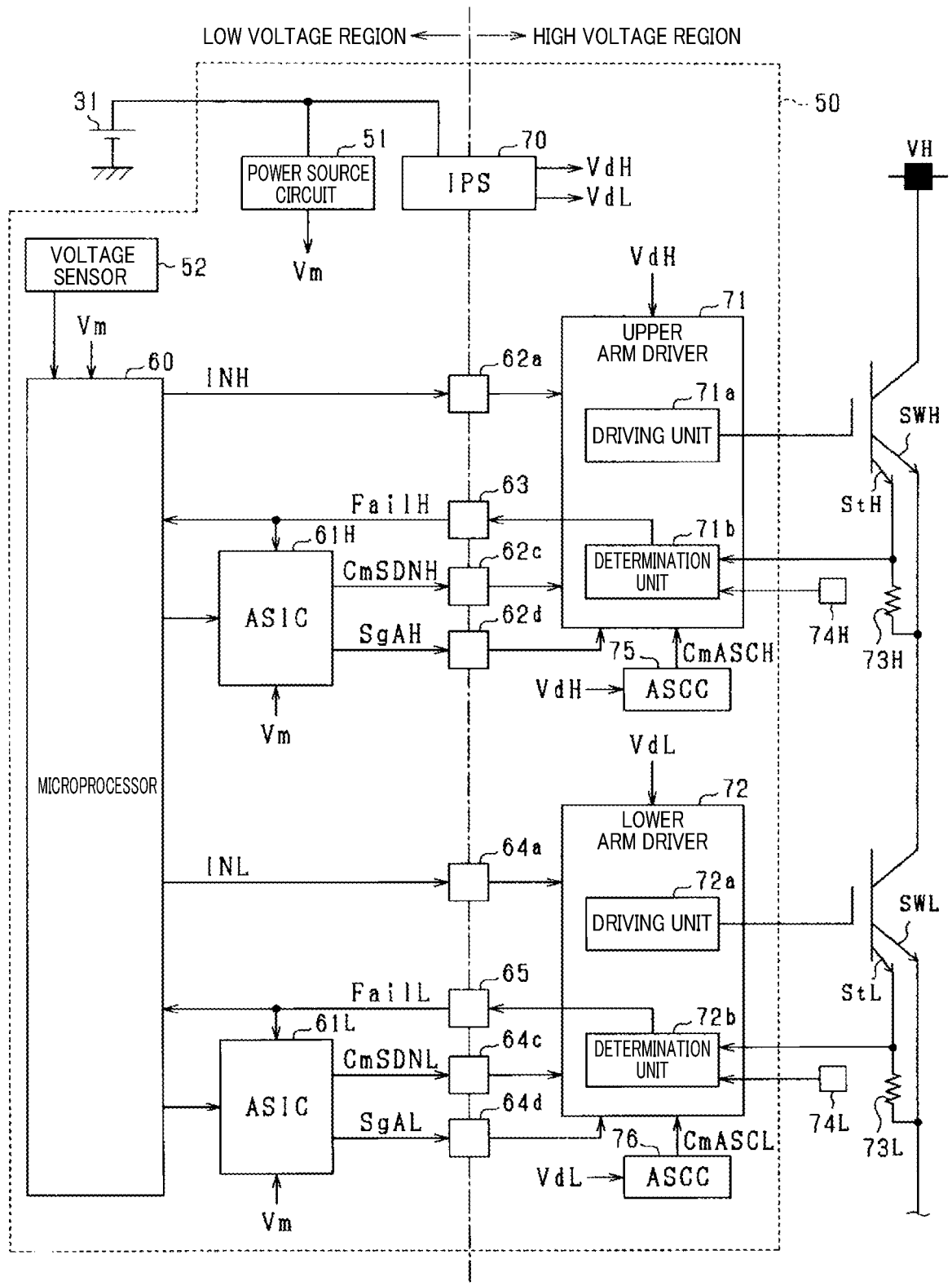
FIG. 11 is a block diagram showing a control circuit and a peripheral circuit thereof according to a fourth embodiment.

Hereinafter, with reference to the drawings, for a fourth embodiment, configurations different from those in the first embodiment will mainly be described. FIG. 11 shows a control circuit 50 and a peripheral circuit thereof according to the present embodiment. In FIG. 11, the same reference numbers are applied to configurations which are the same as those shown in FIG. 2 for the sake of convenience.

According to the present embodiment, the upper and lower arm ASC commands CmASCH and CmASCL are not outputted from the microprocessor 60. The control circuit 50 is provided with an upper arm ASC command unit 75 and a lower arm ASC command unit 76. The upper arm drive voltage VdH of the insulation power source 70 is supplied to the upper arm ASC command unit 75 and the lower arm drive voltage VdL of the insulation power source 70 is supplied to the lower arm ASC command unit 76.

The upper arm ASC command unit 75 outputs the upper arm ASC command CmASCH to the upper arm driving unit 71a. The upper arm ASC command CmASCH changes, based on a decrease in the upper arm drive voltage VdH, the upper arm switch SWH to be in a driving state corresponding to the upper arm ASC or the lower arm ASC. Specifically, the upper arm ASC command unit 75 outputs, when determined that the upper arm drive voltage VdH decreases to be lower than or equal to a first predetermined voltage, the upper arm ASC command CmASCH that changes the upper arm switch SWH to be in a driving state corresponding to the upper arm ASC or the lower arm ASC, to the upper arm driving unit 71a.

The lower arm ASC command unit 76 outputs the lower arm ASC command CmASCL to the lower arm driving unit 72a. The lower arm ASC command CmASCL changes, based on a decrease in the lower arm drive voltage VdL, the lower arm switch SWL to be in a driving state corresponding to the upper arm ASC or the lower arm ASC. Specifically, the lower arm ASC command unit 76 outputs, when determined that the lower arm drive voltage VdL decreases to be lower than or equal to a second predetermined voltage, the lower arm ASC command CmASCL that changes the lower arm switch SWL to be in a driving state corresponding to the upper arm ASC or the lower arm ASC, to the lower arm driving unit 72a.

Note that the upper and lower arm ASC command units 75 and 76 may acquire information indicating which arm a short circuit failure or an open failure has occurred in, the upper arm switch SWH or the lower arm switch SWL, from the microprocessor 60, for example. According to the present embodiment, the upper and lower arm ASC command units 75 and 76 correspond to short-circuit control unit.

According to the above-described embodiments, a three-phase short circuit control can be performed even when an abnormality occurs in the control circuit 50 which causes a shutdown state according to the conventional technique. The shutdown state refers to state where the upper and lower switches SWH and SWL for three-phases are in OFF state. Here, an abnormality in the control circuit 50 includes a failure in the microprocessor 60, a failure in the power source circuit 51 and a failure in which an output voltage cannot be outputted from the insulation power source 70. The failure in which an output voltage cannot be outputted from the insulation power source 70 includes a failure in the insulation power source 70, a failure in which power cannot be supplied to the insulation power source 70 from the low voltage power source 31. The failure in which power cannot be supplied to the insulation power source 70 from the low voltage power source 31 occurs, for example, when an electrical path from the low voltage power source 31 to the insulation power source 70 is broken. For example, the above-described failures may occur due to vehicle collision.

Other Embodiment

The above-described embodiments may be modified as follows.

The respective drivers 71 and 72 may be provided in the low voltage region and the high voltage region in the control circuit 50 to be positioned across the boundary between the low voltage region and the high voltage region.

In the configuration shown in FIG. 1, a boost converter may be provided between the smoothing capacitor 24 and the respective cutoff switches 23a and 23b.

As a switch that constitutes the switching device unit, it is not limited to IGBT, but may be a N-channel MOSFET including a body diode. In this case, the drain corresponds to high voltage side terminal and the source corresponds to low voltage side terminal.

As respective arm switches that constitute the switching device unit, two or more switches which are connected in parallel with each other. In this case, as a combination of parallelly connected switches, for example, a combination of a SiC switching element and a Si switching element, or a combination of IGBT and MOSFET may be utilized.

As a control quantity of the rotary electric machine, it is not limited to a torque but may be a rotational speed of the rotor in the rotary electric machine.

The rotary electric machine is not limited to a permanent magnet synchronous machine, but may be a field winding synchronous machine, for example. Further, as the rotary electric machine, it is not limited to the synchronous machines but may be an induction motor. Moreover, as the rotary electric machine, it is not limited to one used for an on-vehicle main machine, but may be one used for other purpose such as an automatic power steering apparatus, a motor constituting an air-conditioning compressor.

The control unit and method thereof disclosed in the present disclosure may be accomplished by a dedicated computer constituted of a processor and a memory programmed to execute one or more functions embodied by computer programs. Alternatively, the control unit and method thereof disclosed in the present disclosure may be accomplished by a dedicated computer provided by a processor configured of one or more dedicated hardware logic circuits. Further, the control unit and method thereof disclosed in the present disclosure may be accomplished by one or more dedicated computer where a processor and a memory programmed to execute one or more functions, and a processor configured of one or more hardware logic circuits are combined. Furthermore, the computer programs may be stored, as instruction codes executed by the computer, into a computer readable non-transitory tangible recording media.

The present disclosure has been described in accordance with the embodiments. However, the present disclosure is not limited to the embodiments and structure thereof. The present disclosure includes various modification examples and modifications within the equivalent configurations. Further, various combinations and modes and other combinations and modes including one element or more or less elements of those various combinations are within the range and technical scope of the present disclosure.

CONCLUSION

The present disclosure is to provide a control circuit for a power conversion apparatus capable of protecting the switches from over current event when the checking process is performed for checking whether the short circuit control is correctly performed.

The present disclosure is provided with a control circuit of a power conversion apparatus adapted for a system provided with a storage unit, a multiphase rotary electric machine, a power conversion apparatus having upper and lower arm switches electrically connected to each winding in multiphase windings of the rotary electric machine. The control circuit includes: a switch driving unit that drives the upper and lower arm switches; a short circuit control unit that causes the switch driving unit to execute a short circuit control when a failure occurs in the system, the short circuit control turning an ON side switch as a switch of one arm in either an upper arm or a lower arm to be an ON state and turning an OFF side switch as a switch of the other arm to be an OFF state; a checking unit that executes a checking process to check whether the short circuit control is able to performed correctly; and a protection control unit that causes the switch driving unit to execute a protection control when a failure occurs on either the upper arm switch or the lower arm switch, the protection control turning the switch where the failure occurs to be an OFF state, in which the control circuit enables the protection control during execution of the checking process.

In state where a short circuit failure occurs on the OFF side switch, when a checking process is performed to check whether the short circuit control is able to perform correctly, an upper and lower arm short circuit occurs. In this case, an over current flows through the switches. According to the present disclosure, during execution of the checking process, the protection control by the protection control unit is enabled. Hence, the protection control unit determines that a failure occurs on a switch where the over current flows, and turns the switch OFF. Thus, in the case where the checking process is executed, the switches can be protected from over current.

What is claimed is:

1. A control circuit of a power conversion apparatus adapted for a system provided with a storage unit, a multiphase rotary electric machine, a power conversion apparatus having upper and lower arm switches electrically connected to each winding in multiphase windings of the rotary electric machine, the control circuit comprising:
   a switch driving unit that drives the upper and lower arm switches;
   a short circuit control unit that causes the switch driving unit to execute a short circuit control when a failure occurs in the system, the short circuit control turning an ON side switch as a switch of one arm in either an upper arm or a lower arm to be in an ON state and turning an OFF side switch as a switch of the other arm to be in an OFF state;
   a checking unit that executes a checking process to check whether the short circuit control is able to perform correctly, the checking process being executed when the switch driving unit turns the ON side switch to be in an ON state; and a protection control unit that causes the switch driving unit to execute a protection control when a failure occurs on either the upper arm switch or the lower arm switch, the protection control turning the switch where the failure occurs to be in an OFF state, wherein the protection control unit causes the switch driving unit to execute, when determined that an over current failure occurs on the ON side switch, the protection control to turn the ON side switch to be in an OFF state.

2. The control circuit according to claim 1 further comprising:

a disabling control unit that outputs a disabling signal to the switch driving unit, the disabling signal disabling, even when the protection control unit transmits an execution command to the switch driving unit to execute the protection control during the short circuit control being executed, the execution command of the protection control; and a signal determination unit that monitors the disabling signal outputted from the disabling control unit during the short circuit control not being executed, and determines whether the disabling signal is outputted correctly based on a result of the monitoring.

* * * * *